United States Patent
Seddon et al.

(10) Patent No.: US 9,847,310 B2
(45) Date of Patent: Dec. 19, 2017

(54) FLIP CHIP BONDING ALLOYS

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/812,861

(22) Filed: Jul. 29, 2015

(65) Prior Publication Data

US 2017/0018522 A1 Jan. 19, 2017

Related U.S. Application Data

(60) Provisional application No. 62/194,205, filed on Jul. 18, 2015.

(51) Int. Cl.
*H01L 23/00* (2006.01)
*H01L 25/00* (2006.01)
(Continued)

(52) U.S. Cl.
CPC ........ *H01L 24/17* (2013.01); *H01L 23/49811* (2013.01); *H01L 24/05* (2013.01);
(Continued)

(58) Field of Classification Search
None
See application file for complete search history.

(56) References Cited

U.S. PATENT DOCUMENTS 5,186,383 A * 2/1993 Melton ................ B23K 1/0016
228/180.22
2007/0114662 A1* 5/2007 Helneder ................ H01L 24/11
257/737
(Continued)

FOREIGN PATENT DOCUMENTS

| DE | 19521158 A1 | 2/1997 |
| DE | 102006013583 A1 | 10/2007 |
| WO | 2014023320 A1 | 2/2014 |

OTHER PUBLICATIONS

Takahashi, T. et al., "Development of Ag3Sn Intermetallic Compound Joint for Power Semiconductor Devices," ElectroMechnical and Solid-State Letters, vol. 12, No. 7, Apr. 29, 2009, pp. H263-H265.
(Continued)

*Primary Examiner* — William Coleman
*Assistant Examiner* — Kien Ly
(74) *Attorney, Agent, or Firm* — Polansky & Associates, P.L.L.C.; Paul J. Polansky (57) ABSTRACT

A method of bonding a plurality of die having first and second metal layers on a die surface to a board, comprising placing a first die onto a board comprising one of a ceramic or substrate board or metal lead frame having a solderable surface and placing the first die and the board into a reflow oven. The method includes reflowing at a first reflow temperature for a first period until the first metal board layer and at least one of the first and second metal die layers of the first die form an alloy to adhere the first die to the board. The newly formed alloy has a higher melting temperature than the first reflow temperature. Accordingly, additional die may be reflowed and attached to the board without causing the bonding of the first die to the board to fail if the same reflow temperature is used.

18 Claims, 11 Drawing Sheets

(51) Int. Cl.
*H01L 25/065* (2006.01)
*H01L 23/498* (2006.01)

(52) U.S. Cl.
CPC .............. *H01L 24/11* (2013.01); *H01L 24/16* (2013.01); *H01L 24/81* (2013.01); *H01L 24/97* (2013.01); *H01L 25/0652* (2013.01); *H01L 25/0655* (2013.01); *H01L 25/50* (2013.01); *H01L 24/13* (2013.01); *H01L 2224/0401* (2013.01); *H01L 2224/05073* (2013.01); *H01L 2224/05082* (2013.01); *H01L 2224/05083* (2013.01); *H01L 2224/05147* (2013.01); *H01L 2224/05155* (2013.01); *H01L 2224/05166* (2013.01); *H01L 2224/05639* (2013.01); *H01L 2224/05647* (2013.01); *H01L 2224/05655* (2013.01); *H01L 2224/1131* (2013.01); *H01L 2224/11334* (2013.01); *H01L 2224/11849* (2013.01); *H01L 2224/13083* (2013.01); *H01L 2224/13111* (2013.01); *H01L 2224/13139* (2013.01); *H01L 2224/13155* (2013.01); *H01L 2224/13166* (2013.01); *H01L 2224/13294* (2013.01); *H01L 2224/13311* (2013.01); *H01L 2224/16227* (2013.01); *H01L 2224/16238* (2013.01); *H01L 2224/16245* (2013.01); *H01L 2224/16503* (2013.01); *H01L 2224/81024* (2013.01); *H01L 2224/8181* (2013.01); *H01L 2224/81191* (2013.01); *H01L 2224/81192* (2013.01); *H01L 2224/81193* (2013.01); *H01L 2224/81211* (2013.01); *H01L 2224/81411* (2013.01); *H01L 2224/81439* (2013.01); *H01L 2224/81447* (2013.01); *H01L 2224/81815* (2013.01); *H01L 2224/81825* (2013.01); *H01L 2224/97* (2013.01); *H01L 2924/0105* (2013.01); *H01L 2924/01047* (2013.01); *H01L 2924/15738* (2013.01); *H01L 2924/15747* (2013.01); *H01L 2924/3841* (2013.01)

(56) References Cited

U.S. PATENT DOCUMENTS

| | | | | |
|---|---|---|---|---|
| 2007/0141750 | A1* | 6/2007 | Iwasaki | H01L 24/11 438/108 |
| 2007/0166877 | A1 | 7/2007 | Otremba | |
| 2007/0205253 | A1* | 9/2007 | Hubner | B23K 1/0016 228/193 |
| 2009/0160039 | A1* | 6/2009 | Wong | H01L 23/3107 257/673 |
| 2011/0193219 | A1 | 8/2011 | Lai et al. | |
| 2011/0220704 | A1* | 9/2011 | Liu | B23K 35/0238 228/252 |
| 2012/0306105 | A1 | 12/2012 | Robert | |
| 2013/0017681 | A1 | 1/2013 | Willeke et al. | |
| 2013/0119119 | A1 | 5/2013 | Horng | |
| 2013/0270700 | A1* | 10/2013 | Yu | H01L 23/498 257/738 |
| 2015/0001704 | A1* | 1/2015 | Lu | H01L 24/16 257/737 |
| 2015/0061101 | A1* | 3/2015 | Le | H01L 25/0655 257/676 |
| 2015/0061118 | A1* | 3/2015 | Chen | H01L 24/16 257/737 |
| 2015/0061158 | A1* | 3/2015 | Pharand | H01L 24/11 257/779 |
| 2015/0123253 | A1 | 5/2015 | Hwang | |
| 2015/0163903 | A1* | 6/2015 | Wada | H05K 3/321 361/760 |
| 2015/0179615 | A1* | 6/2015 | Watanabe | H01L 24/16 257/737 |
| 2016/0035688 | A1* | 2/2016 | Fukuhara | H01L 24/14 257/737 |

OTHER PUBLICATIONS

Partial Search Report in European Patent Application No. EP 16 17 9920, mailed Dec. 8, 2016.
IPC/JEDEC J-STD-020E, "Moisture/Reflow Sensitivity Classification for Nonhermetic Surface Mount Devices," © 2014 JEDEC Solid State Technology Association Arlington, VA, Dec. 2014.
Ladani, L.J., et al., "Microstructure and mechanical strength of snag-based solid liquid inter-diffusion bonds for 3 Dimensional integrated circuits", Thin Solid Films, Elsevier, Amsterdam, NL, vol. 518, No. 17, Mar. 19, 2010, pp. 1948-4954.
Search Report in European Patent Application No. EP16179920, dated Dec. 8, 2016, 13 pages.
Search Report in European Patent Application No. EP16179960, dated Mar. 7, 2017, 19 pages.
ONS01994 Action on the Merits by U.S.P.T.0 regarding U.S. Appl. 14/812,846 filed Jul. 29, 2015.
Schmetterer, C., et al., "Phase Equilibria in the Ag-Ni-Sn System: Isothermal Sections", Journal of Electronic Materials, vol. 36, No. 11, Sep. 25, 2007, pp. 1415-1428.

* cited by examiner

FLIP CHIP BONDING ALLOYS

This application claims priority to U.S. Provisional Application No. 62/194,205, filed on Jul. 18, 2015, entitled "FLIP CHIP BONDING ALLOYS," invented by Michael J. Seddon et al.

CROSS-REFERENCE TO RELATED APPLICATIONS

Related subject matter is found in a copending patent application entitled "DIE BONDING TO A BOARD", U.S. patent application Ser. No. 14/812,846, filed Jul. 29, 2015, by Michael J. Seddon et al. and assigned to the assignee hereof.

FIELD OF THE DISCLOSURE

The present disclosure relates generally to circuit manufacturing, and more particularly to flip chip bonding and arrangement techniques.

BACKGROUND

Multichip modules that incorporate flip chip design implementations are increasingly being used for a large variety of applications. In many cases, it is advantageous to utilize established integrated circuit designs for a variety of operations and/or functions. Accordingly, the established designs found in manufactured die are therefore combined on a single board or multichip module. For a variety of manufacturing considerations, however, the various integrated circuit devices, and more particularly flip-chip devices, are not always installed into the multichip modules at the same time. For example, different flip chip devices may be manufactured by different fabrication facilities and, accordingly, are added to the multichip modules at different times. There are multiple techniques that can be used to attach a die to a board or module including wire bonding, die attach film and soldering at the different times. Such applications are often used though not always appropriate for all applications. For example, a wire bond solution may not be appropriate in situations where footprint requirements necessitate efficient integrated circuit (IC) real estate usage.

Solder alloys and pastes are often used in conjunction with a reflow oven or furnace to bond a die to a board. Using solder in either form is beneficial for bonding one die to a board, such as a ceramic or substrate board or metal lead frame, in certain circumstances because a reliable bond is formed once the solder cools after being removed from the reflow oven or furnace. Typically, the solder alloy or paste will flow when the device and board are placed in the reflow oven and will then cool to bond the die to the board and, if desired, to form an electrical connection between the device and board. For the case of a single die, this approach is also beneficial in that the die may be removed if faulty by subsequently reflowing the die and board in the reflow oven or furnace. This process typically requires, however, for sufficient spacing between die and between bond pads of the die so that the solder, when melted during reflow, does not spread to contact other bond pads of a current die being reflowed or of another die.

Another issue with using solder alloys or paste, however, is that the solder will melt and reflow when the board and another die are placed in the reflow oven to bond the new die to the board. Accordingly, the bond that adheres the originally bonded die may fail while the solder is being melted in the reflow oven or furnace to bond the subsequent die. One approach to solve this problem has been to use different metal alloys for the first die so that the metal alloys bonding the die have a higher reflow temperature than what is needed for re-flowing the solder alloys. Two metals that have been used to this end include lead and gold because they have higher melting temperatures. Lead, however, is known to cause health issues and is not always desirable. Gold, on the other hand, is expensive and drives up product cost. To form a gold layer on a die or board that is to be subsequently etched away and then melted during a reflow is wasteful of a precious metal unless such an approach is necessary. Accordingly, solder is often used despite its limitations.

BRIEF DESCRIPTION OF THE DRAWINGS

The present disclosure may be better understood, and its numerous features and advantages made apparent to those skilled in the art by referencing the accompanying drawings according to various embodiments in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
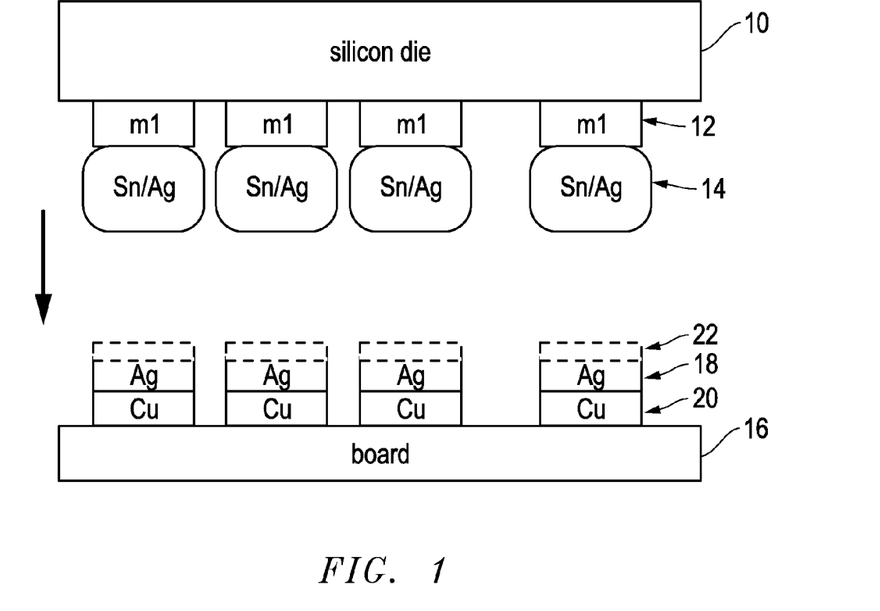
FIG. 1 is a side view of a circuit board and a first flip chip prior to bonding the first flip chip to the circuit board.

FIG. 1 is a side view of a circuit board and a first flip chip prior to bonding the first flip chip to the circuit board. FIG.

1 illustrates a system that includes a silicon die or flip chip 10 having a plurality of bond pads, each of the bond pads comprising a metal layer 12. A solder paste 14 comprising a combination of tin and silver is deposited onto bond pads that comprise metal layer 12. A board 16 comprises bond pads further comprising metal layers 18 and 20. The bond pads of the die and the board are formed to have substantially similar bond pad patterns. Board 16 may be constructed in any known manner and may comprise, for example, a ceramic or substrate board. Alternatively, a metal lead frame may be used in place of a board. Hereinafter, whenever any reference to a board, a ceramic board, a substrate board or a metal lead frame is used, it should be understood that any one of the other supporting structural elements (board, substrate board, ceramic board or metal lead frame) could be used alternatively. Optionally, flux 22 may be applied to the outer metal layer of the bond pads of the flip chip or board to prevent oxidation. Here, flux 22 is shown only on the bond pads of board 16.

Metal layers 18 and 20 of board 16 comprise at least one of a solderable metal layer such silver, tin or copper. In the described embodiment, a silver layer 18 and a copper layer 20 are used prior to creating the bond pads on board 16 in a pattern that is substantially similar to a bond pad pattern of flip chip 10. Metal layers 18 and 20 may also comprise a plurality of metal or metal alloy layers, for example, copper (Cu), nickel (Ni), tin (Sn) or silver (Ag) or an alloy formed of two or more metals. The flip chip 10 may include two or more layers though only one layer is shown here not counting the solder paste bumps shown at 14. While FIG. 1 shows only one layer 12 on the bond pads of flip chip 10 and two layers 18 and 20 on the bond pads of board 16, the embodiments are not limited and the die and board may include additional layers. Moreover, any one layer may be an alloy and is not required to be a single element or metal. Metal m1 of layer 12 may comprise a variety of different metals or metal alloys. The metal layer 12 on the flip chip 10 may comprise a combination of silver, tin and nickel in one embodiment though a silver metal layer 12 is used in the described embodiment. In an alternative embodiment, m1 comprises nickel.

As is suggested in FIG. 1, flip chip 10 is to be attached to board 16 (more specifically, to layer 18 of the bond pads of board 16). A solder paste is used to blend with other metals of the flip chip or board to bond the flip chip to the board during reflow. Here, however, the metals or metal alloys of the plurality of metal layers on the die and board are selected so that they melt or diffuse to form an alloy with the solder paste 14 during reflow to have a subsequent reflow temperature that is higher than the temperature used during reflow of the original metal layers to create the alloy. In the described embodiment, metals are chosen so that, even if a solder or solder paste is used, the metals will melt or diffuse to mix with the solder to create an alloy with a reflow temperature that is higher than what is required to reflow solder. To "reflow" a board and one or more die, the board is often placed within a reflow furnace or oven at a specified temperature profile over a specified period. Other technologies for reflowing the metals may also be used in alternative processes. Any reference herein to a furnace or oven should be understood to include alternative technologies for melting or reflowing the metal layers of the die and board.

Figure 2:
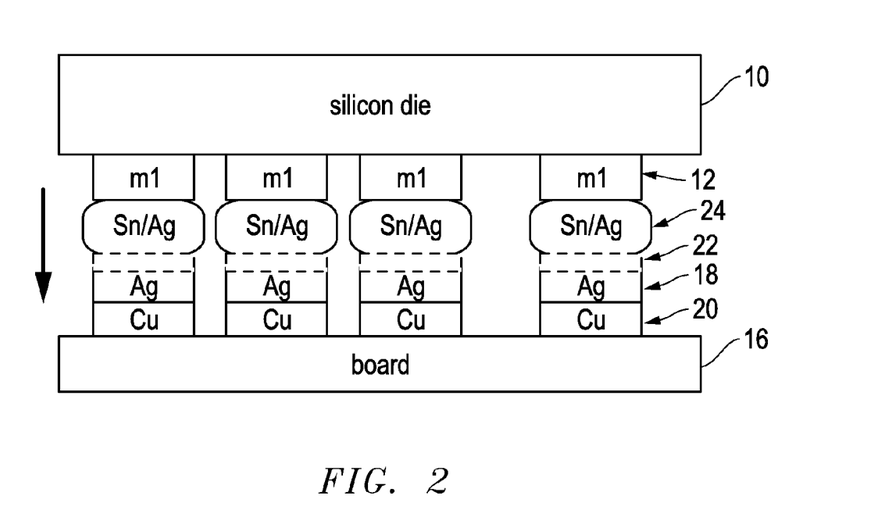
FIG. 2 is a side view of a circuit board and a first flip chip prior to bonding the first flip chip to the circuit board but after the solder paste has been reflowed into an alloy.

FIG. 2 is a side view of a circuit board and a first flip chip prior to bonding the first flip chip to the circuit board but after the solder paste shown generally at 14 in FIG. 1 has been reflowed into an alloy. FIG. 2 illustrates a system that includes a silicon die or flip chip 10 having a plurality of bond pads each comprising a metal layer 12. A solder paste 14 of the flip chip comprising a combination of tin and silver previously deposited onto the metal layer 12 bond pads has been reflowed at a low reflow temperature to create alloy 24. FIG. 2 illustrates that a method for flip chip mounting the flip chip typically comprises performing, prior to placing the flip chip onto the bond pads of the board, an initial low temperature reflow to reflow the tin/silver solder paste to prompt the paste to harden into an alloy 24 (here, a silver-tin alloy based on the composition of the solder paste). In the described embodiment, this initial reflow approximately occurs at 230-235 degrees C. At this temperature, the tin/silver solder will melt but the silver (and other metal layers if present of flip chip 10) will not melt. As described above, flip chip 10 includes bond pads comprising at least one metal layer. Accordingly, the solder paste 14 is deposited on the flip chip bond pads prior to the first reflow. During the first reflow, any flux that is present and impurities are burned off and a first alloy 24 is formed out of the metallic paste 14.

Figure 3:
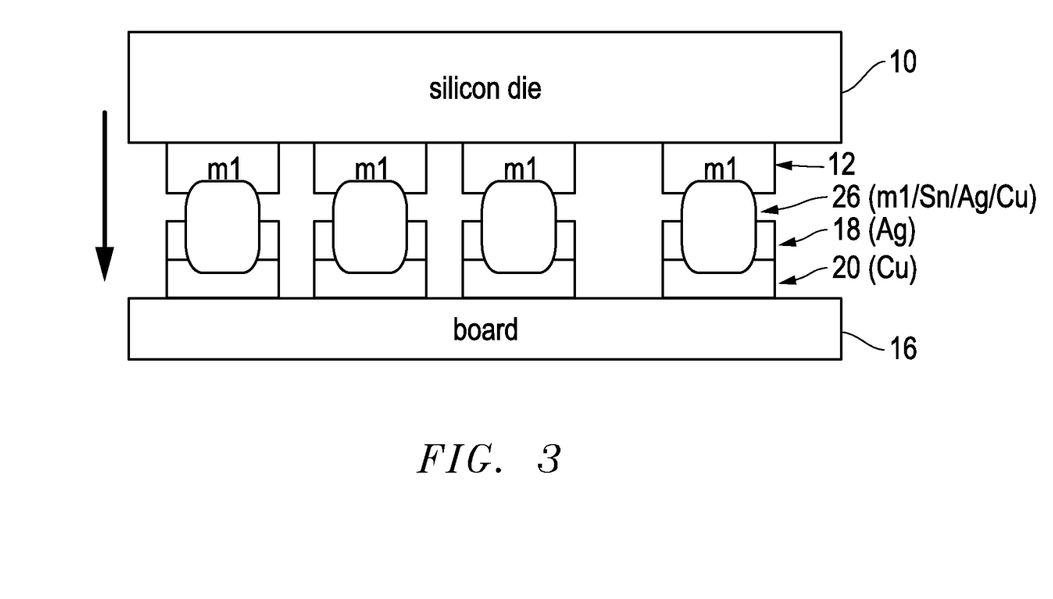
FIG. 3 is a side view of a circuit board and a first flip chip after bonding the first flip chip to the circuit board and after the solder paste has been reflowed into an alloy.

FIG. 3 is a side view of a circuit board and a first flip chip after bonding the first flip chip to the circuit board and after the solder paste has been reflowed into an alloy with other metals. As previously mentioned, the board includes bond pads having a bond pad pattern similar to that of the flip chip. The bond pads of the board comprise a plurality of metal layers in the described embodiment. Subsequently, after the flip chip 10 with the first alloy 24 already formed thereon is flip chip mounted onto the board, a second reflow of the board and flip chip is subsequently performed at a second reflow temperature to form a second alloy 26 as shown here in FIG. 3 between each of the plurality of the bond pad layers of the flip chip (now including the tin/silver (Sn/Ag) metal layer 24) and the metal layers of the bond pads of the board.

In the described embodiment, the second melting temperature is approximately 250 degrees C. The second alloy 26 that is formed from the second reflow has a melting temperature that is higher than the second reflow temperature (eg., 260 degrees C.). In the described embodiment, the melting temperature of the second alloy 26 is higher than the second reflow temperature and may be at least 10 degrees C. higher than the second reflow temperature used to create the second alloy 26. For example, depending on the ratios of the metals and the metal combinations that are used, the alloy 26 melting temperature will be greater than 260 degrees C. and may be approximately 270 degrees C. As may be seen, second alloy 26 is intermixed with portions of layers 12, 18 and 20 of flip chip 10 and board 16. Because the typical reflow temperature is approximately 260 degrees C., which is less than the melting temperature of alloy 26, alloy 26 won't completely melt during subsequent reflow processes. For this example, alloy 26 has metal from layers 12, 18 and 20 though this is not required. At a minimum, alloy 26 has at least one metal of layers 12, 18 and 20.

Figure 4:
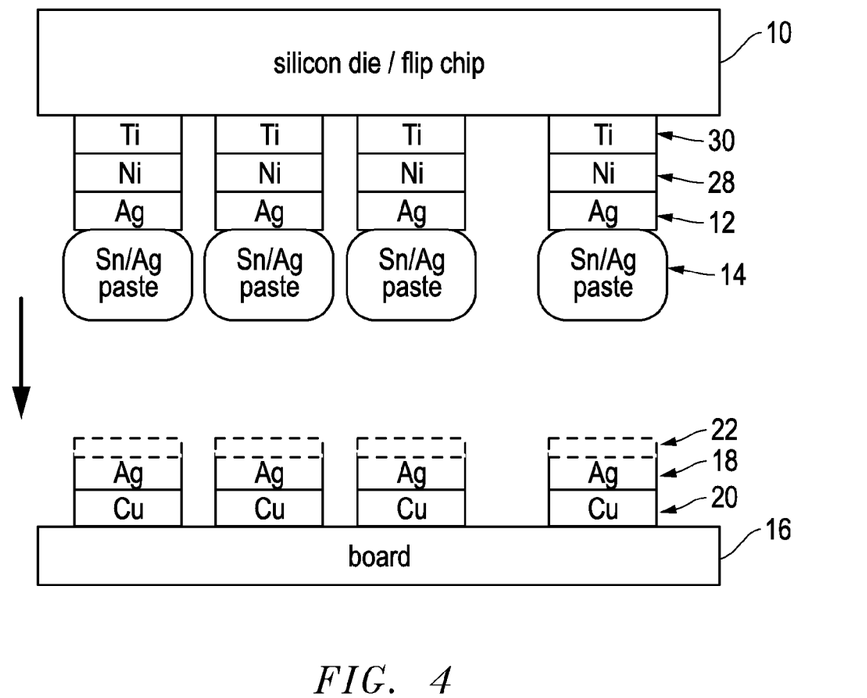
FIG. 4 is a side view of a circuit board and a first flip chip prior to bonding the first flip chip to the circuit board.

FIG. 4 is a side view of a circuit board and a first flip chip prior to bonding the first flip chip to the circuit board. FIG. 4 illustrates a system that includes a flip chip 10 having a plurality of bond pads comprising a plurality of metal layers, namely metal layers 12, 28 and 30. Metal layer 12 comprises silver. Metal layer 28 comprises nickel while metal layer 30 comprises titanium in the described embodiment. A solder paste 14 comprising a combination of tin and silver is deposited onto the metal layer 12 bond pads of flip chip 10.

Board 16 comprises bond pads further comprising metal layers 18 and 20. Metal layers 18 and 20 comprise silver and copper, respectively, as with the example of FIG. 1. The bond pad patterns comprising metal layers 12, 28 and 30 of flip chip 10 and metal layers 18 and 20 of board 16 are substantially similar. Board 16 may be constructed in any known manner and may comprise, for example, a ceramic or substrate board. Alternatively, a metal lead frame may be used in place of a board. Optionally, flux 22 may be applied to the outer metal layer of the bond pads of the flip chip or board to prevent oxidation. Here, flux 22 is shown only on the bond pads of board 16.

Metal layers 18 and 20 of board 16 comprises at least one of a solderable metal layer such silver, tin or copper. In the described embodiment, a silver layer 18 and a copper layer 20 are used prior to etching to create bond pads in a pattern that is substantially similar to a bond pad pattern of flip chip 10. Metal layers 18 and 20 may comprise a plurality of metal or metal alloy layers, for example, copper, nickel, tin or silver or an alloy formed of two or more metals. The metal layers 12, 28 and 30 on the flip chip may comprise a combination of silver, tin and nickel in one embodiment. In the described embodiment, metal layers 12, 28 and 30 comprise a silver layer, a nickel layer and a titanium layer, respectively.

While FIG. 4 shows three metal layers 12, 28 and 30 on flip chip 10 and two layers 18 and 20 on board 16, the embodiments are not limited and the die and board may include additional layers or a lesser number of layers. Moreover, any one layer may be an alloy and is not required to be a single element or metal as described here in relation to FIG. 4.

Figure 5:
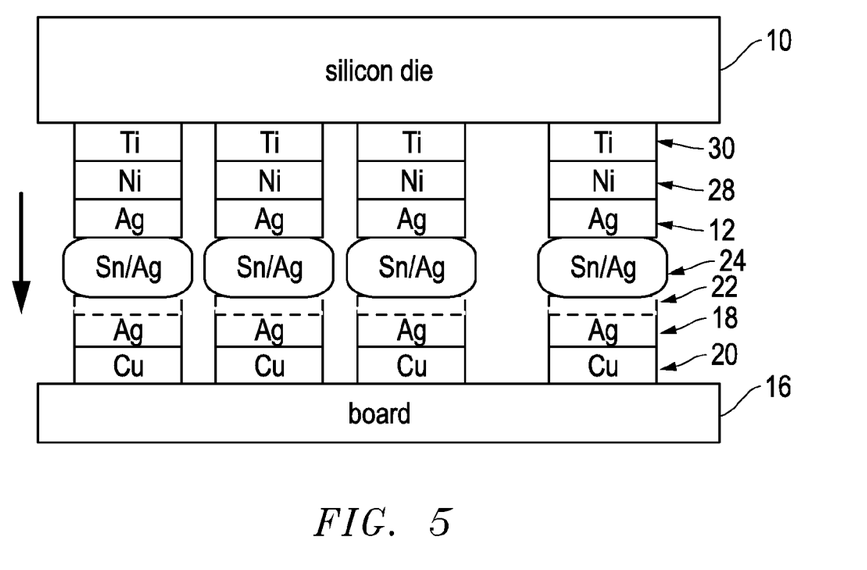
FIG. 5 is a side view of a circuit board and a first flip chip prior to bonding the first flip chip to the circuit board but after the solder paste has been reflowed into an alloy.

As is suggested in FIG. 4, flip chip 10 is to be attached to board 16 (more specifically, to layer 18 of the bond pads of board 16). A solder paste is used to blend with other metals of the flip chip or board to bond the flip chip bond pads to the board bond pads. Here, however, the metals or metal alloys of the plurality of metal layers on the die and board are selected so that they melt or diffuse to form an alloy with the solder paste 14 during reflow, the alloy having a subsequent melting temperature that is higher than the temperature used during reflow of the original metal layers to create the alloy 24 (as shown in FIG. 5). In the described embodiment, metals are chosen so that, even if a solder or solder paste 14 is used to create alloy 24, the metals will melt or diffuse to mix with the solder alloy 24 to create an alloy with a melting temperature that is higher than what is required to melt solder.

FIG. 5 is a side view of a circuit board and a first flip chip prior to bonding the first flip chip to the circuit board but after the solder paste has been reflowed into an alloy. FIG. 5 illustrates a system that includes a silicon die or flip chip 10 having a plurality of bond pads comprising metal layers 12, 28 and 30. A solder paste 14 comprising a combination of tin and silver that has been previously deposited onto the metal layer 12 bond pads has been reflowed at a low reflow temperature to create alloy 24 as shown in FIG. 5. FIG. 5 illustrates that a method for flip chip mounting a the flip chip typically comprises performing, prior to placing the flip chip onto the bond pads of the board, an initial low temperature reflow to reflow the tin/silver solder paste to prompt the paste to harden into an alloy 24 (here, a silver-tin alloy based on the composition of the solder paste).

In the described embodiment, this initial reflow to create the silver/tin alloy approximately occurs at 230-235 degrees C. As described above, flip chip 10 includes bond pads comprising at least one metal layer though three metal layers are shown here. Accordingly, the solder paste 14 is deposited on the flip chip bond pads prior to the first reflow. During the first reflow, any flux that is present and impurities are burned off and a first alloy 24 is formed out of the metallic paste 14 though none of metal layers 12, 28 and 30 will melt because this first reflow temperature is below the reflow temperature for layers 12, 28-30 and 18-20.

Figure 6:
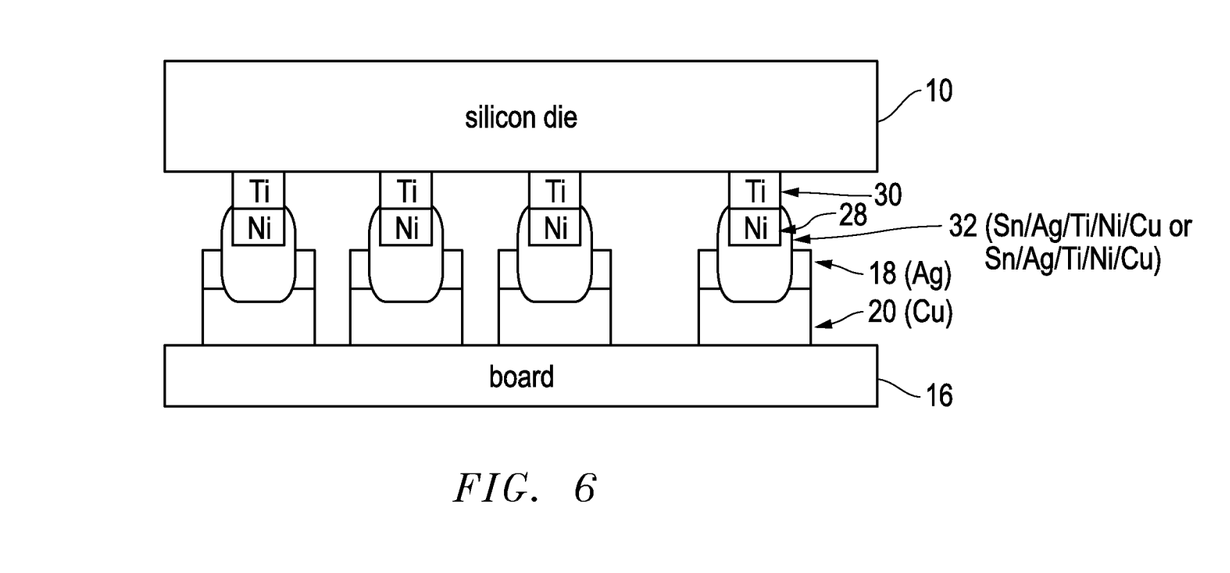
FIG. 6 is a side view of a circuit board and a first flip chip after bonding the first flip chip to the circuit board and after the solder alloy has been reflowed into an alloy with other metals.

FIG. 6 is a side view of a circuit board and a first flip chip after bonding the first flip chip to the circuit board and after the solder alloy has been reflowed into an alloy with other metals. As also mentioned, the board includes a connection points or bond pads having a bond pad pattern similar to that of flip chip 10. The bond pads of the flip chip 10 and board 16 each comprise a plurality of metal layers in the described embodiment. Subsequently, after flip chip 10 with the first alloy 24 already formed thereon is flip chip mounted onto the board, a second temperature reflow of the board and flip chip is subsequently performed at a second reflow temperature to form a second alloy 32 between at least one of the plurality of the bond pad layers of the flip chip (now including the Sn/Ag metal layer 24) and the plurality of layers of the bond pads of board 16.

In the described embodiment, the second melting temperature is approximately 250 degrees C. The second alloy 32 that is formed from the second reflow comprises a melting temperature that is higher than the second reflow temperature. In the described embodiment, the melting temperature of the second alloy 32 is at least 10 degrees C. higher than the second reflow temperature used to create the second alloy 32. For example, depending on the ratios of the metals and the metal combinations that are used, the alloy 32 melting temperature may be approximately 270 degrees C. (which is approximately 10-20 degrees higher).

The second alloy 32 comprises metal from both the flip chip and the board. One aspect of the embodiment of FIG. 6, is that the second alloy was created during a second reflow without completely melting or reflowing the metal and alloy layers of any die that had been previously bonded during previous reflow processes because of the higher melting temperatures of the alloys formed during the previous reflow processes.

One aspect of the various embodiments of the invention is that the alloy bumps used to bond the flip chip bond pads to the board bond pads are formed have a subsequent melting temperature that is higher than the reflow temperature that created the alloy initially. Another aspect is that the metallic composition of the alloy is based not only on the metals layers used for the flip chip and board bond pads, but also their relative thicknesses and a duration of the reflow process. A temperature profile for a reflow defines both a temperature and a period. As the period of the temperature profile is increased, the number metal layers and amount of metal layer melting and diffusing increases thereby increasing the number of metals within alloy 32 or changing a ratio of metals in the resulting alloy 32. It should be noted that, because the ratios of metal may gradually change depending on original metal layer thicknesses and also based on a total period of the reflow process to create the alloys, the resulting alloy may not be homogenous meaning that intermetallic alloys may be created instead of homogenous alloys (constant composition through out the alloy). Accordingly, it should be understood that the term intermetallics may be used in place of alloy more appropriately depending on the results of the reflow. Two factors that affect this include reflow duration and relative layer thickness and construction. All discussion herein relating to alloys should be understood to be a reference to and include intermetallic alloys where appropriate.

Continuing to refer to FIG. 6, if the reflow is for a minimal amount of time, alloy 32 may consist of silver and tin. As the reflow period is extended according to the reflow profile, additional metals may melt to become a part of alloy 32. For example, with an increased reflow period, alloy 32 may comprise nickel as well as the silver and tin. With yet a greater increased reflow period, alloy 32 may also comprise titanium (from the flip chip in the described embodiment and/or copper from the board). The reflow characteristics of the resulting alloy bump may vary according to the metals within the alloy. Accordingly, the reflow temperature profile and (temperature and duration) affect what metals are within the alloy and therefore, possibly, a melting temperature during subsequent reflows. In all cases, however, the melting temperature of the created alloy is higher than the temperature used during reflow to melt the metals to create the alloy.

In one of the described embodiments, the thickness used for the various bond pad metal layers of the flip chip are as follows:

Titanium: 1.15 kA (though this can be substantially varied).
Nickel: 0.2 kA (thicker layer may be used for higher temperature applications or if a thick layer of tin used.
Silver: 4 kA (can be varied from 1 kA to 12 kA)
Tin: 2 kA-36 kA.

The ratio of silver to tin may be adjusted based on the application. For example, increasing the tin alloys for additional wetting to the board and helps reduce voids if the surface is rough or porous. Increasing the silver increases the protection of the nickel. Too much silver, however, will restrict the amount of NiSn intermetallics to be formed and can therefore reduce the die shear strength and consistency of the flip chip. Generally, a higher thickness of Tin is used for wetting purposes, but if the thickness is too high, manufacturing problems may occur. In one particular embodiment, the layer of Tin is in the range of 22 kA to 26 kA thick.

The advantages and benefits of the above metals and associated thicknesses is that silver and tin wet well to the solderable surface of a board with a minimum amount of voiding, quickly forms the resulting alloys or intermetallics which limits the flow of the silver and tin across the board. Further, the melting temperature of the alloys quickly rises above the reflow temperature to prevent future melting during subsequent reflows. Thus, the flip chip will stay in place during subsequent reflows when other devices are mounted to the board and reflowed.

Depending on the relative metal layer thicknesses and the temperature profiles used during reflow, copper from the board may also melt to become a part of the alloy that is created during reflow. This strengthens the bond to provide a strong die attach and reduces the amount of nickel and tin ratios from the resulting alloy. It should be noted further that the silver between the nickel and tin impedes the diffusion of the tin with the nickel and limits the nickel/tin alloy which therefore allows creation of stronger flip chip bonds between the bond pads of the flip chips and the board.

Alternative metal (pure and alloy) layer combinations that yield similar results include:

Ti/Ni/Cu/Ag/AgSn;
Ti/Ni/Cu/Sn;
Ti/Cu/Ag/AgSn;
Ti/Cu/Ag/Sn;
Ti/Cu/AgSn; and
Ti/Cu/Sn.

The various embodiments increase the melting temperature of the solder joint or alloy that bonds the flip chip or die bond pads to the board bond pads. Generally, the structure includes a die or flip chip solderable surface of silver/tin on top a layered bond pad comprising titanium, nickel and silver layers. The silver/tin bonds the flip chip to a solderable surface of the board. In one embodiment, the solderable surface of the board comprises silver. Alternatively, the solderable surface comprises copper. In yet another embodiment, the solderable surface comprises both silver and copper.

Regarding the use of tin or silver/tin alloys, the silver/tin alloy typically has a composition of ≤6.5 Wt % silver one at least one layer in a flip chip device to wet to a solderable surface without the use of additional solder paste or preforms. Generally, the process includes applying silver/tin solder paste or pure tin to a solderable surface such as titanium/nickel/silver such that the final composition of silver/tin is ≤6.5 Wt % silver. With such a composition, a melting temperature to convert the paste to an alloy is in the range of 230 degrees C. to 250 degrees C. In one specific embodiment, a reflow oven or furnace temperature operating at a temperature in the range of 233-235 degrees C. is used to melt the paste to form a first alloy.

During a subsequent reflow at approximately 250-260 degrees C., the titanium/nickel/silver/silver-tin solderable surface will melt to bond a die or flip chip to a solderable surface of the board and to create a new alloy that will not fully melt during subsequent reflow processes used to attach additional die to the board. The silver/tin intermetallics are formed from a top layer of silver-tin or tin along with the other described metal layers will not fully melt during subsequent reflow profiles.

Figure 7:
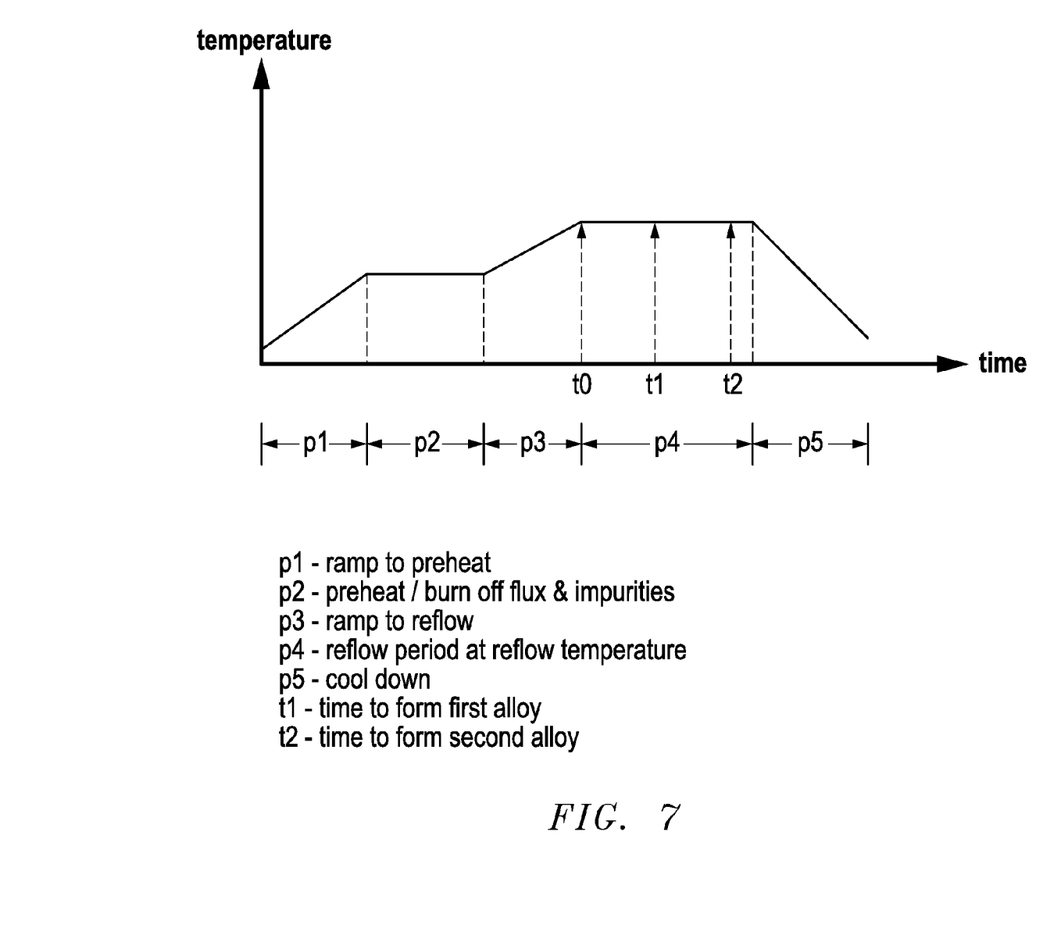
FIG. 7 is a temperature-time graph that illustrates a reflow thermal profile for a first flip chip mounted on a board or metal lead frame according to one embodiment.

FIG. 7 is a temperature-time graph that illustrates a reflow thermal profile for a first flip chip mounted on a board or metal lead frame according to one embodiment. Referring now to FIG. 7, a reflow thermal profile graph is shown that identifies five time periods p1-p5 that represent the various thermal stages used in a process according to one embodiment. As may be seen, period p1 represents a heating ramp to preheat the reflow oven to a preheat temperature. Period p2 represents the preheat period that is used in a typical reflow process. Period p3 represents a heating ramp to a reflow temperature. Period p4 represents the duration that a reflow temperature is maintained. Period p5 reflects a cool down period that allows the alloy(s) to harden.

Typically, in prior art applications, a reflow temperature is not maintained for any notable duration given the traditional solder elements that are used to bond leads and devices to each other or to a printed circuit board because they melt by or at the time the reflow temperature is reached. Here, however the reflow temperature is maintained at least until a time t1 is reached. Time t1 is an amount of time that is required to melt or diffuse a plurality of metals to form an alloy and to create a bond. This time t1 is a function of what metals are being melted and the relative thickness of the metal layers. Furthermore, as described in relation to previous figures, a plurality of metal layers may be used on at least one of the die or the board.

If the reflow temperature is maintained beyond time t1 to time t2, additional alloys may be formed from the additional metal layers disposed either on the die or on the board. Accordingly, shortly after time t2, period 5 begins representing the cool down period. As described before, the alloys that are formed by the reflow temperature at times t1 and t2 have subsequent melting temperatures that are higher than the reflow temperature of period p4. The process represented by FIG. 7 is a reflow process for a first die or plurality of die or flip chips that are being bonded to the board in the same reflow. Subsequent reflows may utilize the same or a similar thermal profile though the characteristics may be varied according to design requirements.

Figure 8:
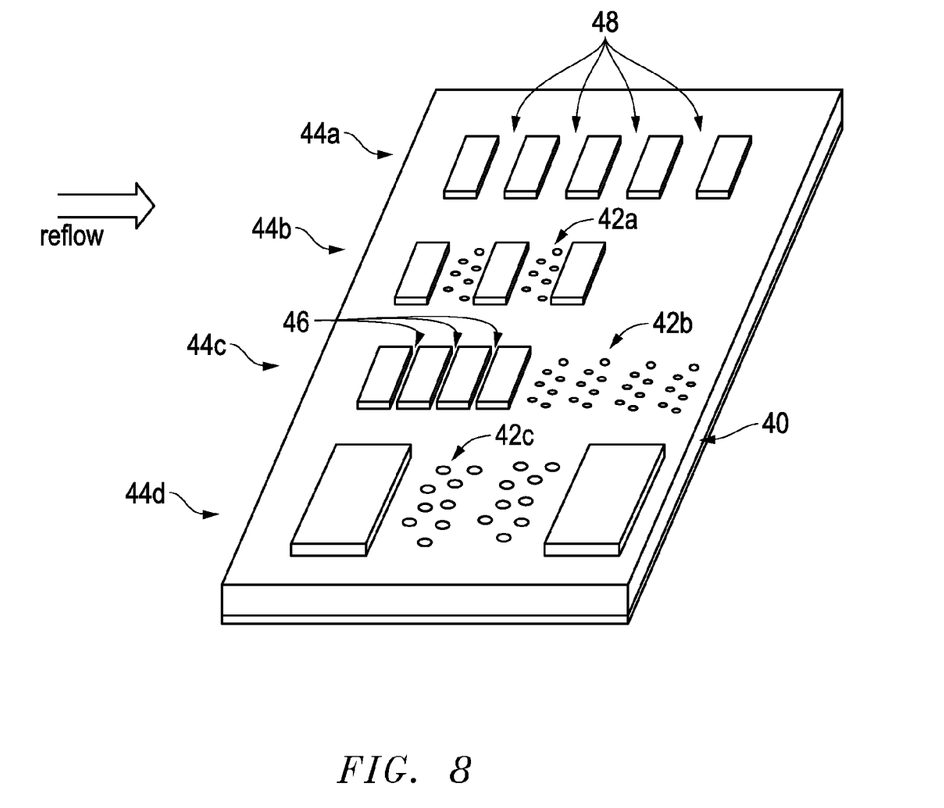
FIG. 8 is an illustration of a board and a plurality of flip chips mounted thereon according to an embodiment.

FIG. 8 is an illustration of a board and a plurality of flip chips mounted thereon according to an embodiment. A board 40, which can comprise a substrate board, a ceramic board or a metal lead frame includes a plurality of bond pad device patterns 42*a-c*. Each bond pad device pattern 42*a-c* has a bond pad pattern that is substantially similar to a bond pad pattern of a die or flip chip that is to be mounted and bonded thereon. More specifically, bond pad device patterns 42*a* and 42*b* are sized and configured to receive smaller die or flip chips as shown in rows 44*a*, 44*b* and 44*c* while bond pad device patterns 42*c* are sized and configured to receive larger die or flip chips as shown in row 44*d*.

The flip chips or die that are mounted on board 40 may be separated by very little space as shown generally at 46 when mounted and bonded according to one or more of the described embodiments. In contrast, a substantially larger separation as shown at 48 is required if a solder is used that does not create an alloy with a higher melting temperature because during reflow and or subsequent reflows, the solder will melt and can flow to create shorts between proximate bond pads or devices. Because of the process described herein does not flow like a traditional solder at a standard solder melting temperature, the process and structures described for the embodiments may be used for very small scale applications in the future.

The number of transistors being formed within integrated circuits is ever increasing. At the same time, integrated circuit devices sizes are substantially diminishing. Chip manufacturers have relied on the continued scaling down of the transistor size to achieve the exponential growth in transistor counts, but known techniques for bonding die may limit future scaling. For example, parts of the latest transistors are only a few atoms thick, and, therefore, the size of the integrated circuit die will shrink with the scaling of transistors. While current devices are now as small as 100 microns (millionths of a meter), it is believed that future devices may be as small as 5-15 pico-meters wide. Accordingly, in the future, entire integrated circuits may be developed that are too small to readily see with the human eye. Regardless of whether such scaling is actually achieved, it is certain that current trends to reduce device sizes will continue to the point that current techniques for bonding the devices will have to be modified. Such integrated circuits or micro-die will have to be bonded to a host platform such as a substrate or ceramic board or other type of packaging with connection points or bond pads.

This level of integration will be difficult to achieve due to the components' miniscule dimensions. It might be impossible to individually pattern the small components of the microelectronics in the ways that current fabrication processes allow. While current ICs can have almost any arbitrary pattern, these microelectronics layouts may be driven by physical process limitations. One aspect of the present embodiments is that solders used for bonding do not flow to create shorts between adjacent bond pads or connection points, leads or nodes. Referring back to FIG. 8, therefore, the layout of bond pad patterns allow for close placement of the individual die or flip chips with a minimal spacing such as that shown at 46 instead for a more notable spacing such as that shown at 48 because solder flow creating shorts between proximate devices and bond pads is not an issue. Further, it should be understood that the embodiment of FIG. 8 may represent such microcircuits as well as flip chip devices that are being made today.

Figure 9:
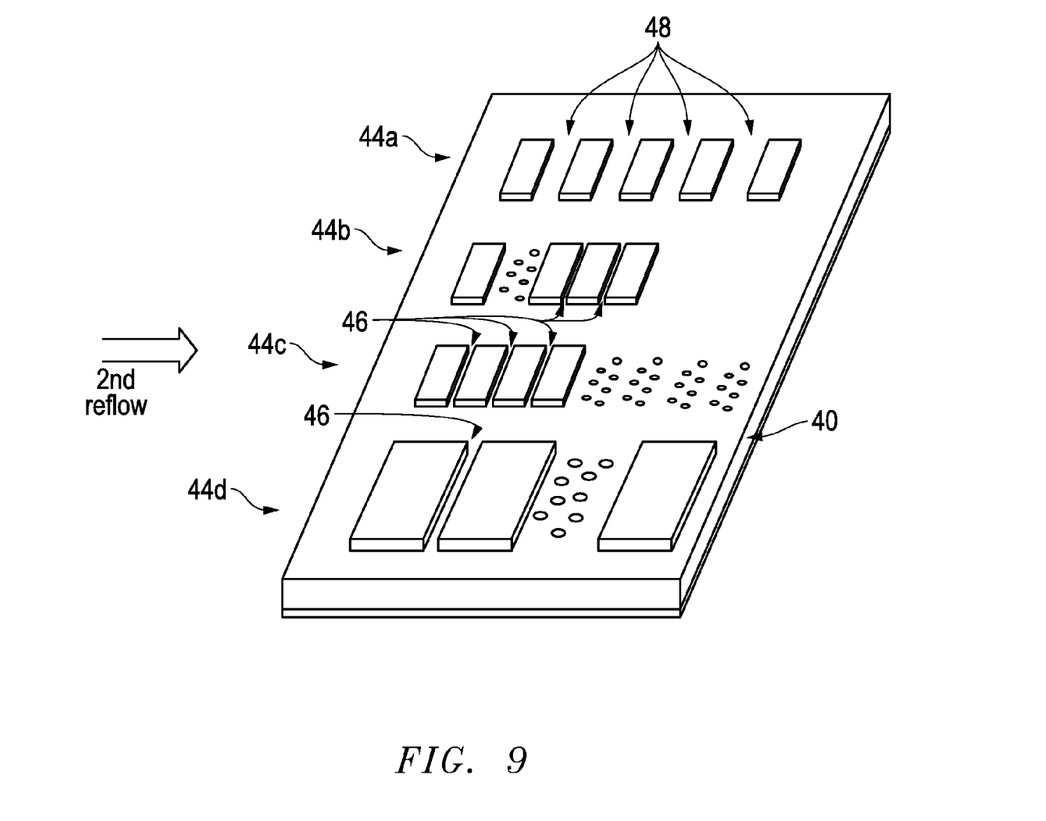
FIG. 9 is an illustration of a board and a plurality of flip chips mounted thereon according to an embodiment after a subsequent reflow to add at least one more flip chip or die.

FIG. 9 is an illustration of a board and a plurality of flip chips mounted thereon according to an embodiment after a subsequent reflow to add at least one more flip chip or die. FIG. 9 primarily illustrates that even with a subsequent reflow to add at least one more device, flip chip or die, that the described embodiment allows the device to be added and reflowed to create a bond without damaging existing bonds or creating shorts between proximate bond pads and/or devices. As may be seen, a smaller die or flip chip was added to the row of devices shown at 44*b* and a larger die or flip chip was added to the row of devices shown at 44*d*. It should be noted that die may be added to both sides of a board. Only one side is shown here for simplicity. This applies to all embodiments. Moreover, the embodiments described herein may be used for multi-chip modules comprising stacked die having bond pads on both sides.

Figure 10:
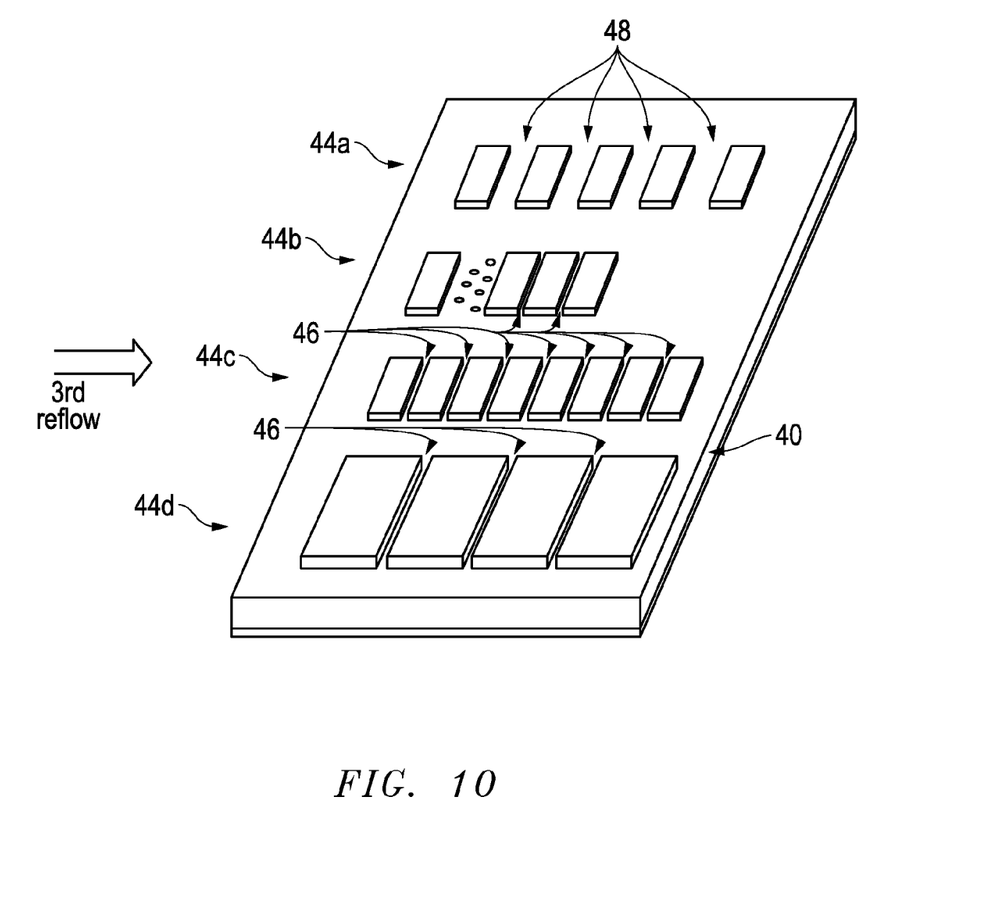
FIG. 10 is an illustration of a board and a plurality of flip chips mounted thereon according to an embodiment after a subsequent reflow to add at least one more flip chip or die.

FIG. 10 is an illustration of a board and a plurality of flip chips mounted thereon according to an embodiment after a subsequent reflow to add at least one more flip chip or die. FIG. 10 primarily illustrates that even with a subsequent reflow (e.g., a third reflow) to add at least one more device, flip chip or die, that the described embodiment allows the device to be added and reflowed to create a bond without damaging existing bonds or creating shorts between proximate bond pads and/or devices. As may be seen, smaller flip chips were added to the row of devices shown at 44*b* and 44*c* and a larger flip chip was added to the row of devices shown at 44*d* in the two subsequent reflows. Spacing 46 between all of the die or flip chips is substantially less that spacing 48 which requires a spacing that would be required if a conventional solder that would melt at each reflow was used. It should be understood that spacing between bond pads may also be reduced because of the benefits of created alloys having a higher melting temperature.

Figure 11:
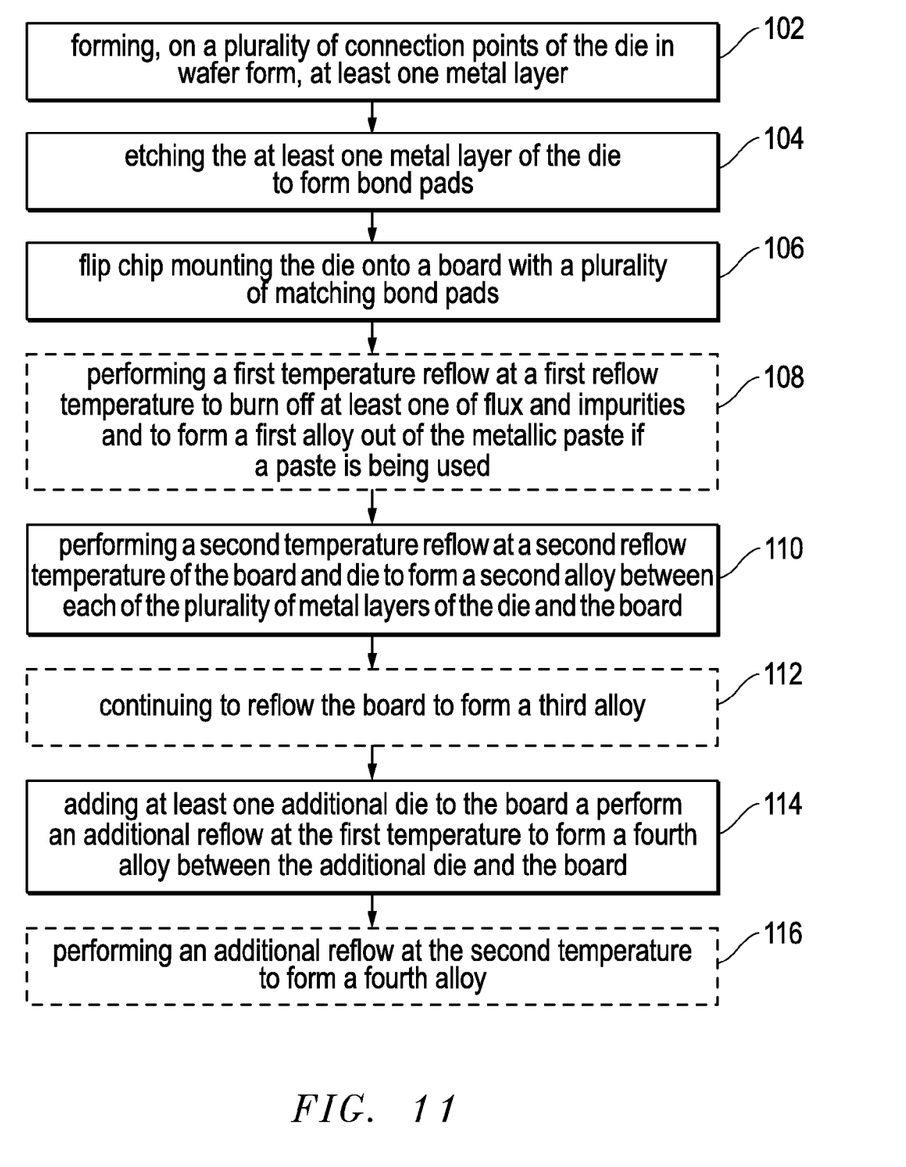
FIG. 11 is a flowchart illustrating a method for bonding a flip chip according to one embodiment.

FIG. 11 is a flowchart illustrating a method for bonding a die according to one embodiment. The method of FIG. 11 begins with forming, on the die in wafer form, at least one metal layer (102). Thereafter, the at least one metal layer is/are etched to form bond pads (104). After the bond pads are formed on the die, the die is flip chip mounted onto a board with a plurality of matching bond pads (106). In the described embodiment, the board is a solderable board. The solderable board may comprise any type of known board used for securing or connecting electronic devices including ceramic boards and substrate boards or metal lead frames. In one embodiment, the metal layer of the solderable board that is used to create the bond pads of the board is a solderable metal layer such as tin or copper. The board, in the disclosed embodiment, includes two metal layers formed on one surface while the die includes at least one solderable metal layer. The die is placed on the board so that the outer metal layers of board and first die are in contact with each other.

Thereafter, the method includes performing a first temperature reflow at a first reflow temperature to burn off at least one of flux and impurities and to form a first alloy out of the metallic paste if a paste is being used (108). Thereafter, the method includes performing a second temperature reflow at a second reflow temperature of the board and die to form a second alloy between each of the plurality of metal layers of the bond pads of the die and the board and the first alloy created during the first reflow if a solder paste was used (110).

The temperature profile for these reflows may include a temperature ramp to a specified temperature and the beginning a cool down period or a ramp to a desired temperature and then maintaining the temperature or a temperature range for a specified period or duration sufficient to allow the metal layers to reflow to create at least one alloy. Reference herein to temperature profiles include any combination of temperature and time that is used to melt the die and board metal layers to create the desired alloys and/or intermetallics. The method optionally includes continuing the reflow after one alloy has already been created according to a second temperature profile (e.g. at the first reflow temperature profile for a second period) to continue to reflow the first die and one or more of the metal layers of the die and the board to form a third alloy (112).

After a first reflow process is concluded and any formed alloys have cooled and hardened, the method includes placing a second die or flip chip (or a plurality of second dies or flip chips) on the solderable board and placing the board with the first and second die in the reflow furnace or oven (112). Thereafter, second die and board metal layers are reflowed according to a third reflow temperature profile without completely re-flowing any alloy metals of the first die and board that were created during the first reflow process. The second die and board metal layers are re-flowed to form a fourth alloy for the second die and board (114). Finally, the method optionally includes continuing to reflow the metal layers of the second die and board according to a fourth temperature profile to form a fifth alloy for the second die (116). It should be understood that the first, second, third and fourth temperature profiles may be similar or may be varied. Similarly, the second, third, fourth and fifth alloys and/or intermetallics that are created are based on the temperature profiles and metal layer compositions and may therefore be similar or different.

Figure 12:
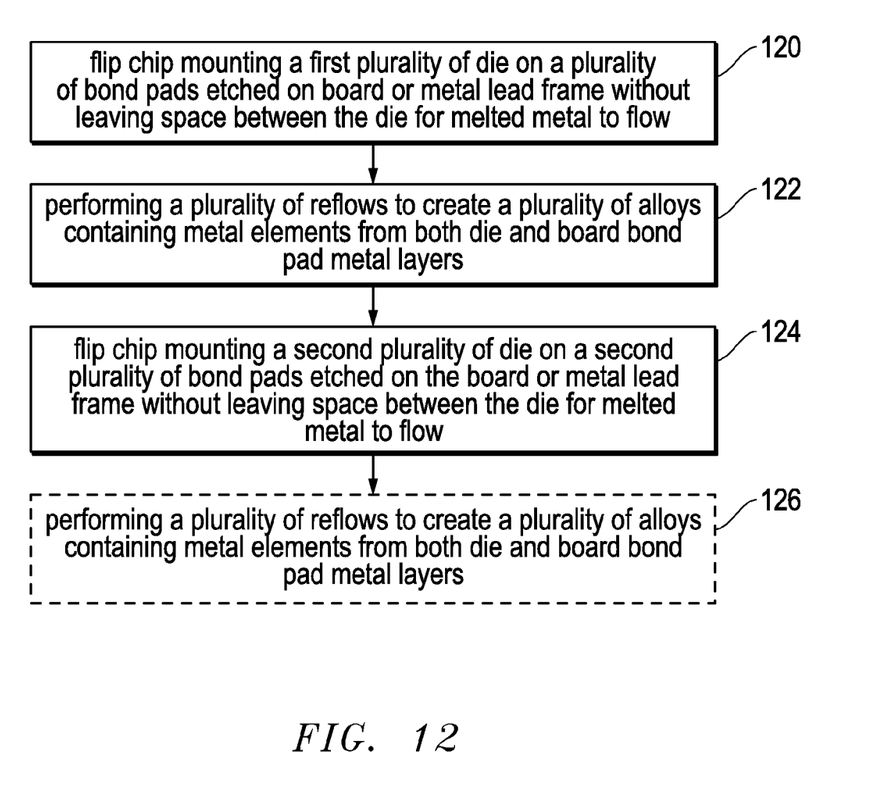
FIG. 12 is a flowchart illustrating a method for bonding a plurality of flip chips according to one embodiment.

FIG. 12 is a flowchart illustrating a method for bonding a plurality of die according to one embodiment. The method commences with flip chip mounting a first plurality of die on a plurality of bond pads etched on a board or metal lead frame without leaving space between the die for melted metal to flow (120). Thereafter, the method includes performing a plurality of reflows to create a plurality of alloys containing metal elements from both die and board bond pad metal layers (122). Subsequently, the method includes flip chip mounting a second plurality of die on a second plurality of bond pads etched on the board or metal lead frame without leaving space between the die for melted metal to flow (124). Finally, the method concludes with performing a plurality of reflows to create a plurality of alloys containing metal elements from both die and board bond pad metal layers (126).

One aspect of the method illustrated in FIG. 12 is that a solder that melts and flows away from its bond pad is not a problem with the reflows that are performed in relation to die or flip chip mounting and bonding according to the various embodiments. Accordingly, individual die/flip chips may be arranged and placed in very close proximity.

Figure 13:
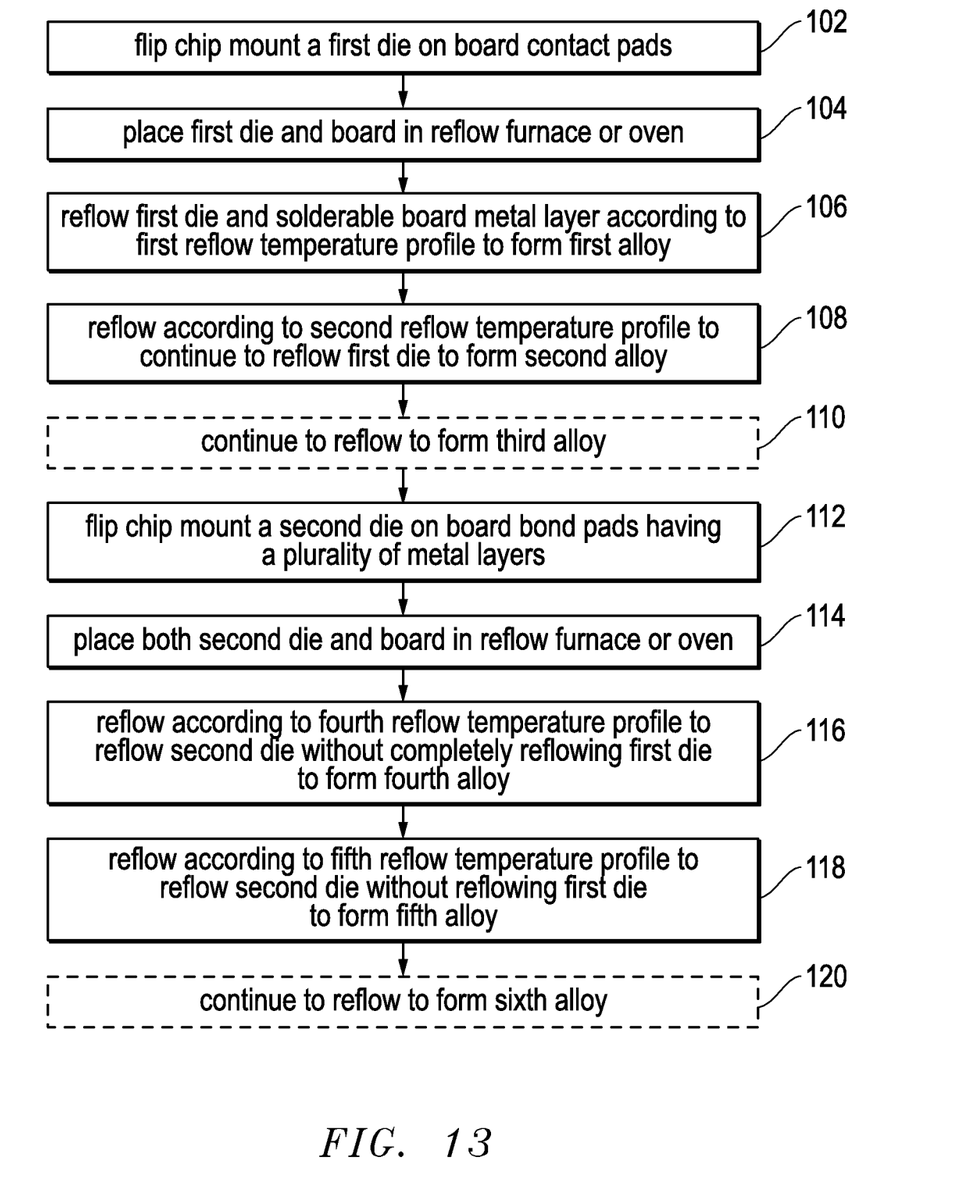
FIG. 13 is a flowchart illustrating a method for bonding a plurality of flip chips according to one embodiment.

FIG. 13 is a flowchart illustrating a method for bonding a plurality of die according to one embodiment. The method commences with flip chip mounting a first die on board contact pads (102) and placing the first die and board in a reflow furnace or oven (104). Thereafter, the method includes reflowing the first die and a solderable board metal layer according to first reflow temperature profile to form first alloy (106). This first reflow typically is for burning off impurities and flux and to form an alloy out of a solder paste if a solder paste is being used in the process.

Thereafter, the method continues with reflowing according to second reflow temperature profile to continue to reflow first die to form a second alloy (108). This second alloy comprises at least one metal from the bond pad metal layer and/or the solder paste and at least one metal from the solderable board bond pad metal layer. Thereafter, the method includes continuing to reflow the first die and board to form third alloy (110).

In the described embodiment, a least three metals are used in the process. In the second reflow, at least one metal melts to form the second alloy that includes diffused metal from another layer. By continuing to reflow the flip chip/die and board, a third metal melts and mixes with the first and second metals to form the third alloy comprising at least three metals. After this process is completed and the alloys are allowed to cool and harden, the method includes flip chip mounting a second die on the board bond pads having a plurality of metal layers (112) and placing both the second die and board having the bonded first die into the reflow furnace or oven (114) reflow according to fourth reflow temperature profile to reflow second die without completely reflowing first die to form fourth alloy (116). As with the first alloy, the fourth alloy formed here is from the solder paste if a solder paste is used in the process. Thereafter, the method includes reflowing according to a fifth reflow temperature profile to reflow second die without reflowing first die to form fifth alloy (118) similar to the second alloy. Finally the method includes optionally continuing to reflow to form a sixth alloy (120).

The above discussions and descriptions of the figures relate to adhering the bond pads of a die or flip chip to the bond pads of a board. The above-disclosed subject matter is to be considered illustrative, and not restrictive, and the appended claims are intended to cover all such modifications, enhancements, and other embodiments that fall within the true scope of the claims.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for flip chip mounting at least one die to a board, comprising:
    forming a plurality of solderable bond pads on a first die having at least one metal layer;
    depositing one of a solderable paste or bump on at least one of the plurality bond pads on the first die, for bonding to each of a plurality of matching bond pads of the board having at least two metal layers;
    performing a first reflow operation at a first reflow temperature to burn off at least one of flux and impurities and to melt the solderable paste or bump to form a first alloy;
    flip chip mounting the first die onto the board;
    performing a second reflow operation at a second reflow temperature to melt at least a portion of the first alloy to form a second alloy having a melting temperature that is higher than the first and second reflow temperatures, the second alloy including metal from bond pads of at least one of the die and the board; and
    subsequently flip chip mounting a second die to the board and subjecting the first and second die and the board to the first and second reflow temperatures in corresponding first and second reflow operations, thereby mounting the second die onto the board.

2. The method of claim 1 wherein the first die includes bond pads having a titanium layer, a nickel layer and a silver layer.

3. The method of claim 1 wherein the bond pads of the board comprise a copper layer.

4. The method of claim 1 wherein the bond pads of the board comprise a copper layer and a silver layer.

5. The method of claim 1 wherein the second alloy comprises metal from both the first die and board metal layers.

6. The method of claim 1 further including depositing a metallic paste on a top metal layer of the bond pads of the first die prior to flip chip mounting the second die.

7. An apparatus, comprising:
a board that further includes a plurality of bond pads in a board bond pad pattern, each bond pad having at least one metal layer;
a first die having a plurality of bond pads having a die bond pad pattern that matches the board bond pad pattern, wherein the first die is flip chip mounted to the board;
wherein:
the plurality of bond pads of the first die comprise at least two metal layers; and
the plurality of bond pads of the board and the plurality of matching bond pads of the die are bonded with an alloy having a melting temperature that is higher than first and second reflow temperatures that were used to bond the board bond pads and the plurality of matching bond pads of the first die, through one of a solderable paste or bump deposited on the plurality bond pads, during corresponding first and second reflow operations; and
the board further includes a bond pad device pattern for mounting a second die after the first die has been flip chip mounted to the board.

8. The apparatus of claim 7 wherein the plurality of bond pads of the first die comprise at least three metal layers.

9. The apparatus of claim 7 wherein the plurality of bond pads of the board comprise at least two metal layers.

10. The apparatus of claim 9 wherein the at least two metal layers of the plurality of bond pads of the die comprise silver and tin.

11. The apparatus of claim 10 wherein the at least one metal layer of the plurality of bond pads of the board comprises copper.

12. The apparatus of claim 7 wherein the at least two metal layers of the plurality of bond pads of the first die comprise silver and nickel layers.

13. The apparatus of claim 12 wherein the at least two metal layers of the plurality of bond pads of the die comprise a titanium layer.

14. The apparatus of claim 12 wherein the at least one metal layer of the bond pads of the board comprises silver.

15. The apparatus of claim 12 wherein the at least one metal layer of the bond pads of the board comprises silver and copper layers.

16. The apparatus of claim 7 wherein the alloy comprises one of a tin, silver and copper alloy or a tin and silver alloy.

17. The apparatus of claim 7 further including a plurality of die that are flip chip mounted in proximity without any metals or alloys connecting bond pads of adjacent die.

18. The apparatus of claim 7, wherein:
the first die has a plurality of bond pads that each comprises:
at least one of a nickel and a copper layer; and
at least one of a silver, a tin and a silver/tin alloy layer; and
the board has a plurality of bond pads that each comprises at least one of:
a copper layer;
a silver layer;
a silver/tin alloy layer; and
copper and silver layers.

* * * * *